Sept. 8, 1964 G. A. HEDDEN, JR 3,148,356

PRINTED CIRCUIT CONNECTOR

Filed Sept. 14, 1959

INVENTOR.
GEORGE A. HEDDEN, JR.
BY Christie Parker & Hale
ATTORNEYS

United States Patent Office 3,148,356
Patented Sept. 8, 1964

3,148,356
PRINTED CIRCUIT CONNECTOR
George A. Hedden, Jr., 946 Wapello St., Altadena, Calif.
Filed Sept. 14, 1959, Ser. No. 839,622
5 Claims. (Cl. 340—174)

This invention relates to a connector for printed circuits and, more particularly, is concerned with a multiple conductor element which can be used to provide a plurality of electrical connections between conductors formed on different surfaces of printed circuit boards and the like.

The use of printed circuits in electronic packaging has been developed as a technique for producing miniaturized electronic circuits. Circuit components, such as resistors, capacitors, transistors, and the like are mounted on an insulating board, and interconnections between the components are made by conductive strips which are preformed on the insulating board. Since electrical conductors interconnecting the components are confined to the plane surfaces, multiple connections to individual components are sometimes difficult to accomplish by this technique. For instance, it has heretofore been impractical to apply printed circuit techniques to magnetic core devices except by individually winding the cores in the conventional manner and then interconnecting the windings by printed circuits. Moreover, in many magnetic core circuits where they are interconnected in a matrix requiring the criss-crossing of conductors, printed circuit techniques have never been successfully exploited.

The present invention provides means by which printed circuits can be arranged with a plurality of interconnected parallel boards. Thus, by the present invention, the flexibility of the printed circuits can be greatly extended. In particular, the present invention provides an arrangement by which a plurality of conductive paths can be provided through magnetic cores and the like using printed circuit techniques and without the necessity of individually winding each of the magnetic cores. Magnetic core logic circuits can be constructed by means of the present invention using printed circuits rather than conventional wiring techniques.

In brief, this is accomplished by means of a connector element which comprises an elongated body of electrical insulation material having a plurality of spaced parallel conductors extending lengthwise and supported by the elongated body. A connector element can take a variety of cross-sectional shapes, such as a hollow tubing of circular or any polygonal configuration. The conductors can be formed on the outer surface of the insulating material by standard printed circuit techniques or may be metallic conductors embedded in the insulating material with the conductive surface being exposed. The connector elements can be employed in a variety of ways, as hereinafter more specifically described.

For a more complete understanding of the invention, reference should be made to the accompanying drawings, wherein.

Figure 1:
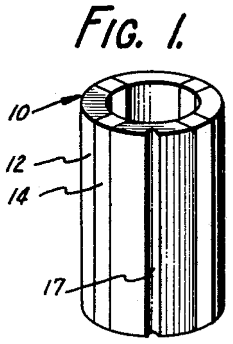
FIG. 1 is a perspective view of one embodiment of the connector element.

As shown in the form of the invention as illustrated in FIG. 1, a connector element, indicated generally at 10, may be in the form of a tube which is made up of elongated alternate insulating and conductive strips indicated at 12 and 14 respectively. In the form of the invention shown in FIG. 1, the conductive strips are of the same thickness as the insulation strips so that conducting surfaces running lengthwise of the connector element are exposed on both the interior surface and the exterior surface of the connector element.

Figure 2:
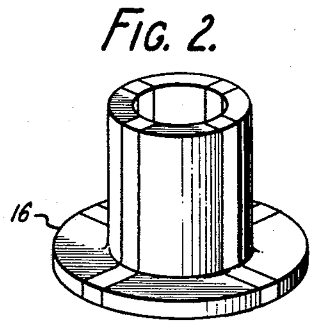
FIG. 2 shows a connector element with a flared end.

The insulating material may be of any suitable substance, but preferably is made of a high dielectric strength plastic which can be readily deformed to provide an expanded flange on one or both ends, such as the flange end indicated at 16 in FIG. 2. The connector elements are preferably made in long lengths and cut into short sections as required.

Connector elements can be constructed in a variety of ways in addition to the arrangement shown in FIG. 1. Where a circular tubing is employed in the form shown in FIG. 1, some keying method may be required in use to properly align the conductor element to make connections with the conductive strips. For example, a longitudinal groove 17 may be used as a key slot.

Figure 3:
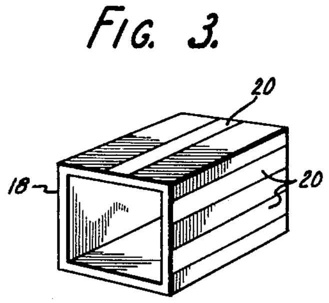
FIGS. 3 and 4 show various cross-sectional shapes and alternative arrangements for the connector element.
Figure 4:
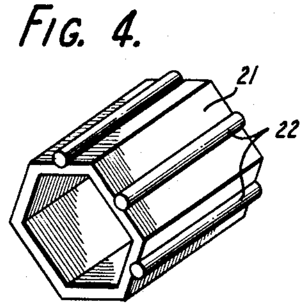

An alternative arrangement is shown in FIG. 3 and in FIG. 4, in which square and hexagonal-shaped elements are shown. The square element 18 in FIG. 3 may be extruded from plastic or other suitable insulating material and have the conductive strips deposited on the outer surface, as indicated at 20, by conventional printed circuit techniques.

In the arrangement shown in FIG. 4, a hexagonal element 21 is shown which again may be extruded from suitable plastic insulating material. In this case, conductive strips 22 are shown of wires which are partially imbedded in the outer surface of the plastic material in a manner to leave longitudinally exposed conductive surfaces on the outside of the connector element. The connector elements need not be hollow but preferably are hollow so that the ends may be easily flared for making electrical connection to conductors on a printed circuit board in the manner hereinafter more fully described.

The above-described conductor elements may be made in a variety of ways, such as by extrusion or by molding, with the conductive strips being molded, pressed, imbedded in the insulating material, or alternatively formed on the surfaces of the insulating material by standard printing, plating or etching techniques used in making printed circuit boards.

Figure 5:
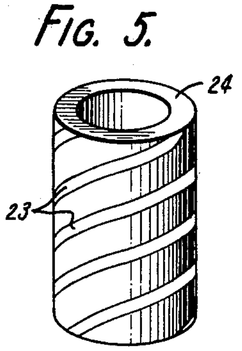
FIG. 5 shows a modification of the connector element in which the conductors are twisted along the length of the element.
Figure 6:
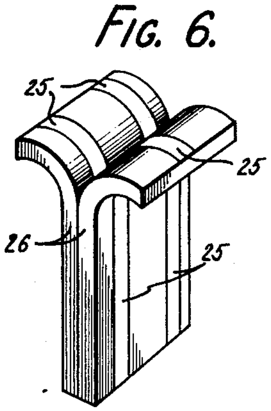
FIG. 6 shows an alternative construction for the connector.

A further alternative arrangement is shown in FIG. 5, in which printed conductive strips 23 are twisted so as to spiral around an insulator tubing 24. In the arrangement of FIG. 6, conductive strips 25 are formed on the surface of flat laminated pieces of insulation strips 26 flared out at the end to facilitate connections to printed circuit boards.

From the description thus far, it will be appreciated that multiple conductor elements are provided according to the present invention which can take a variety of forms and shapes. The particular forms and shapes illustrated are by way of example only. According to the shape and arrangement of the conductors, the connector elements can be fabricated in a number of ways, such as by molding, extruding, bonding of preformed strips, and the other well-known forming and fabricating techniques.

Figure 7:
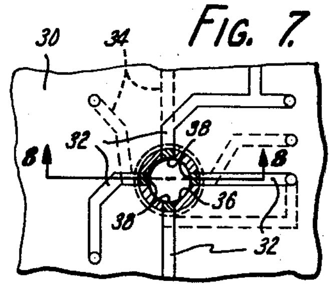
FIG. 7 is a fragmentary enlarged sectional view of one functional embodiment of the present invention.
Figure 8:
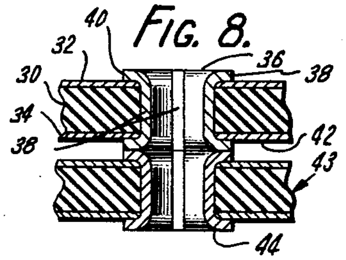
FIG. 8 is a sectional view taken substantially on the line 8—8 of FIG. 7.

Referring to FIGS. 7 and 8, there is shown one printed circuit arrangement using a connector element of the type described above in connection with FIGS. 1 and 2. A printed circuit board is shown which includes a plastic or other type of insulator sheet 30 on which are formed conductive strips 32 and 34 on the top and bottom surfaces respectively. The thickness of the conductive layers 32 and 34 on the surface of the printed circuit board are exaggerated in thickness in FIG. 8 for the sake of clarity. Strips 32 and 34 form conductive paths on the surface of the printed circuit board in a well-known manner.

A connector element of the type described above can be used to make connections between the conductive strips 32 and 34 on the upper and lower surfaces of the printed circuit board. To this end, a hole is provided through which passes a multiconductor connector element 36 having a plurality of conductive strips 38. The ends of the connector element 36 are flared outwardly in the manner described above in connection with FIG. 2 so as to form flange portions, as indicated at 40 and 42, which overlie the surface of the printed circuit board in the region surrounding the hole through which the connector passes. The upper flange 40 is cut away and the connector 36 shown in section in FIG. 7 to clarify the drawing. The individual conductor strips 38, where they are flared over, make contact with the conductor strips 32 and 34 on either surface of the printed circuit board. In this manner, a plurality of electrical circuits are completed between conductive strips 32 on the top surface of the printed circuit board and the corresponding conductive strips 34 on the bottom surface of the printed circuit board. Electrical connections can be by mechanical pressure contact or they may be brazed, soldered, or welded to insure the best electrical connection.

A number of additional printed circuit boards can be interconnected by connector elements in the manner shown in FIG. 7. Thus, a second printed circuit board indicated generally at 43 is provided with a multiple-conductor connector 44 which may abut the flange portion of the connector element 36 and the conductive strips aligned and brazed or soldered to secure the junction.

Figure 9:
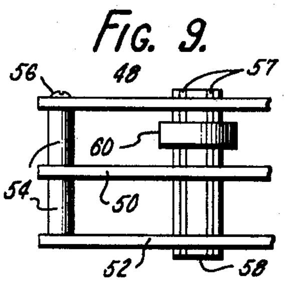
FIG. 9 is an alternative arrangement using the connector element of the present invention.

In the arrangement of FIG. 9, three printed circuit boards 48, 50 and 52 are shown held in spaced relationship by spacers 54 through which passes a bolt 56. A multiconductor element 58 passes through aligned holes in each of the three circuit boards. Electrical connections are completed between conductive strips on the surfaces of the printed circuit boards and conductive strips 57 of the connector element 58 by soldering or brazing the points of contact between the respective conductor strips where desired.

To provide magnetic core logic circuits and the like, suitable magnetic coil elements, as indicated at 60, may be mounted on and surround the connector 58. The multiconductors of the connector 58 pass through the opening of the annular core element 60. By suitable external connections through the printed circuit boards, conductive paths can be completed which loop the core elements in any desired manner to form magnetic core logic circuits, using the technique shown in FIG. 9.

Figure 10:
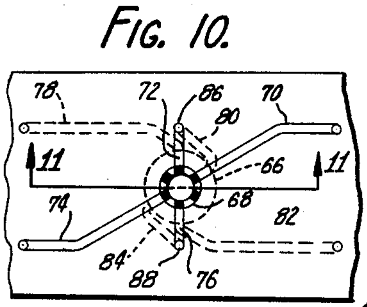
FIG. 10 is a plan view, partly in section, of another arrangement using the connector element of the present invention to form multiple turns linking a core element.
Figure 11:
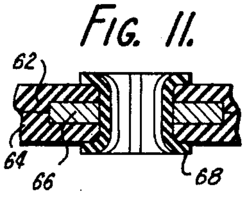
FIG. 11 is a fragmentary sectional view taken on the line 11—11 of FIG. 10.

FIGS. 10 and 11 illustrate one way in which the invention may be used to provide multiple turns linking a magnetic core element. In this arrangement, the magnetic core is imbedded in the insulating board of the printed circuit. This may be accomplished by laminating the printed board as shown in cross-section in FIG. 11.

Thus, the printed board includes first and second laminations 62 and 64 between which is secured an annular core element 66. The laminations 62 and 64 are provided with openings which are coextensive with the opening in the annular core element 66. A multiconductor connector element 68 extends through these openings for making contact with conductive strips on the upper and lower surfaces of the printed circuit board.

In FIG. 10, the upper flange of the connector element 68 is shown cut away. The several conductors of the connector 68 are aligned with conductive strips, such as indicated at 70, 72, 74 and 76, which radiate outwardly from the opening in the circuit board on the top surface. They are similarly aligned with conductive strips 78, 80, 82 and 84 on the lower surface of the printed circuit board, and shown in dotted lines. A conductive pin 86 extending through the printed circuit board makes connection between the conductive strip 80 on the bottom of the circuit board and the conductive strip 72 on the top of the circuit board. Thus, a continuous current path is provided through the conductor strip 70, one conductor of the conductor element 68, the conductive strip 80, the pin 86, the conductive strip 72, a second conductor of the connector 68, and the conductive strip 78. Thus, two complete turns linking the magnetic core element are provided by this arrangement. Similarly, the conductive strips 76 and 84 on opposite sides of the printed circuit board are connected by a conductive pin 88. By this arrangement, a continuous current path is provided between the strip 74 and the strip 82 which links the core element twice through the connector element 68. This technique can be expanded to provide three or more turns as desired.

Figure 13:
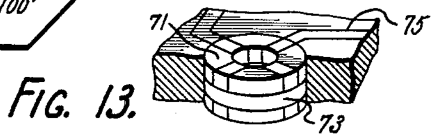
FIG. 13 shows a core device which serves as its own connector.

While the core element is shown embedded, in FIG. 11, it need not be, but may extend to the surfaces of the circuit board. The core element may in fact be made thin enough to be entirely formed on the surface by vacuum deposition, etching, printing, or other techniques. Also, as shown in FIG. 13, the core device and connector element can be preformed as a unit. Thus, a connector element 71, similar to that shown in FIG. 2, is inserted through the opening of an annular core 73 and the end flared over. This unit can be pressed in a hole in a printed circuit board, such as indicated at 75, and the conductor strips soldered or otherwise electrically connected to the corresponding conductor strips on the opposite surfaces of the printed circuit board 75.

Figure 12:
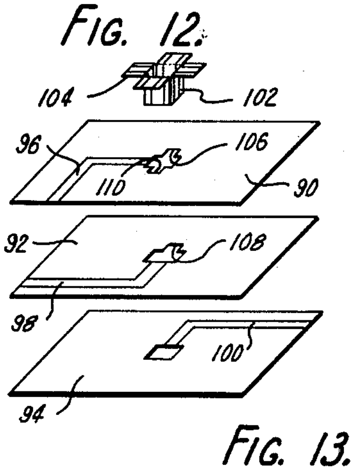
FIG. 12 is a disassembled view showing yet another printed circuit configuration using the connector element of the present invention.

Yet another arrangement for making a plurality connections by means of printed board techniques, and using the multi-conductor connector element of the present invention, is shown in FIG. 12. Frequently, it is necessary in laying out magnetic core logic circuits and the like to have conductors which cross each other without, of course, having electrical connections between the wires. In the arrangement of FIG. 12, this may be readily accomplished by laminating the printed circuit board out of a plurality of very thin insulating sheets such as indicated at 90, 92 and 94. Connections may be made to conductive strips on each of the sheets, such as indicated at 96, 98 and 100, respectively, by means of a multiconductor connector element 102 of the type described above. A connector extends through aligned openings in the several sheets, and the end of the connector may be flared in the same manner as described in connection with FIG. 7. In order to effect contact with conductive strips on all three of the sheets, notches are provided in the overlying sheets. Thus, for contact to be made between a conductor in the flange portion 104 of the connector 102 with the conductive strip 100 on the sheet 94, a notched portion 106 in the sheet 90 and a notched portion 108 in the sheet 92 are provided. The notches provide open spaces permitting a conductive surface on the flange portion 104 to come into contact with the conductive strip 100. Similarly, a notched portion 110 permits another conductor on the connector 102 to come into contact with the conductive strip 98 on the sheet 92. It will be understood that for this purpose, the sheets 90, 92 and 94 are made very thin and deform sufficiently that contact can be effected by the notches through several layers of intermediate sheets.

From the above detailed description of the several embodiments of the invention illustrated, it will be recognized that a large variety of printed circuit designs are possible using the multi-conductor connector technique of the present invention. Particularly, the connector provides a means for forming a plurality of conductive paths linking magnetic core elements, enabling printed circuit techniques to be applied to magnetic core logic circuits.

What is claimed is:

1. In combination, at least one printed circuit board, a plurality of conductive strips on the surface of said board, the board having an opening therethrough, and a connector element extending through the opening including an insulating body and a plurality of conductive strips on the outer surface of the body, at least one end of the insulating body being formed with a flange portion extending parallel to the surface of the printed circuit board, the conductive strips on the flange portion of the connector element overlying and being in contact with conductive strips on the printed circuit board adjacent the opening to form current conductive paths.

2. In combination, at least one printed circuit board, a plurality of conductive strips on the surface of said board, the board having an opening therethrough, and a connector element extending through the opening including an insulating body and a plurality of conductive strips on the outer surface of the body, the conductive strips of the connector element being in contact with conductive strips on the printed circuit board adjacent the opening to form current conductive paths.

3. In combination, a plurality of thin laminated insulating sheets, each of the sheets having conductive strips formed on the surfaces thereof, the sheets having at least one opening with the openings in the several sheets being aligned, the openings in the sheets being selectively notched to expose particular ones of the conductive strips of the sheets beneath the notches, and a connector element extending through the aligned openings including an insulating body and a plurality of conductive strips exposed at the outer surface of the body, at least one end of the insulating body being formed with a flange portion extending parallel to the surfaces of the sheets, the conductive strips on the flange portion of the connector element overlying and being in contact with respective ones of the conductive strips of the several printed circuit sheets, the contact with all but the sheet adjacent the flange being made through the notched portions of the sheets.

4. A preformed core device for use with printed circuits and the like comprising an annular magnetic core, and a connector extending through the core and having flange portions overlying the core on opposite sides of the core, the connector being of insulating material with a plurality of spaced conductors forming conductive paths extending through the annular core to the edge of the flange portions on either side of the core.

5. In combination, at least one printed circuit board, a plurality of conductive strips on the surface of said board, the board having an opening therethrough, a magnetic core element having an opening, and a connector element extending through the opening in said printed circuit board and said magnetic core element including an insulating body and a plurality of conductive strips on the outer surface of the body, at least one end of the insulating body being formed with a flange portion extending parallel to the surface of the printed circuit board, the conductive strips on the flange portion of the connector element overlying and being in contact with conductive strips on the printed circuit board adjacent the opening to form current conductive paths.

References Cited in the file of this patent

UNITED STATES PATENTS

| | | |
|---|---|---|
| 745,336 | Emmet | Dec. 1, 1903 |
| 1,247,297 | Liljenroth | Nov. 20, 1917 |
| 1,910,957 | Llewellyn | May 23, 1933 |
| 2,474,988 | Sargrove | July 5, 1949 |
| 2,476,848 | Eckhordt | July 19, 1949 |
| 2,752,537 | Wolfe | June 26, 1956 |
| 2,816,253 | Blitz | Dec. 10, 1957 |
| 2,910,662 | Rex | Oct. 27, 1959 |
| 2,910,675 | Gessner | Oct. 27, 1959 |